United States Patent
Yokotani et al.

[11] Patent Number: 6,111,403
[45] Date of Patent: Aug. 29, 2000

[54] MAGNETIC DETECTOR WHEREIN THE MAGNETIC FLUX CROSSES THE SENSING ELEMENTS AT A PREDETERMINED ANGLE

[75] Inventors: Masahiro Yokotani; Yasuyoshi Hatazawa; Izuru Shinjo; Takuji Nada, all of Tokyo, Japan

[73] Assignee: Mitsubishi Denki Kabushiki Kaisha, Tokyo, Japan

[21] Appl. No.: 09/161,675

[22] Filed: Sep. 29, 1998

[30] Foreign Application Priority Data

Apr. 20, 1998 [JP] Japan .................................. 10-109818

[51] Int. Cl.[7] .............................. G01B 7/14; G01B 7/30; G01R 33/09
[52] U.S. Cl. ................................ 324/207.21; 324/207.25
[58] Field of Search ........................... 324/207.12, 207.2, 324/207.21, 207.25, 252, 260, 173, 174; 338/32 R, 32 H

[56] References Cited

U.S. PATENT DOCUMENTS

| | | | |
|---|---|---|---|
| 5,477,143 | 12/1995 | Wu ...................................... | 324/207.21 |
| 5,596,272 | 1/1997 | Busch ................................. | 324/207.21 |
| 5,600,238 | 2/1997 | Holloway et al. ................... | 324/207.21 |
| 5,801,529 | 9/1998 | Umemoto et al. .................. | 324/207.21 |

OTHER PUBLICATIONS

"Magnetoresistance of Multilayers" Journal of Applied Magnetism Society of Japan, vol. 15, No. 5, 1991 pp. 813–821.

*Primary Examiner*—Jay Patidar
*Attorney, Agent, or Firm*—Sughrue, Mion, Zinn, Macpeak & Seas, PLLC

[57] ABSTRACT

A magnetic detector is disclosed with a power-on function which can essentially eliminate temperature characteristics of a magnetic field sensing device and improve edge detecting accuracy of alternately projected and recessed portions of a moving member of magnetic material. The magnetic detector comprises a magnet for generating a magnetic field, a rotary member of magnetic material disposed with a predetermined gap remaining relative to the magnet and having alternately projected and recessed portions to change the magnetic field generated by the magnet, and a magnetoresistive device comprising a plurality of magnetic field sensing elements and detecting changes in the magnetic field by movement of the rotary member of magnetic material. The magnetic flux crosses the plurality of magnetic field sensing elements at a first predetermined angle when the recessed portion of the moving member of magnetic material is opposed to the magnetic field sensing device, and the magnetic flux crosses the plurality of magnetic field sensing elements at a second predetermined angle when the projected portion of the moving member of magnetic material is opposed to the magnetic field sensing device. The first and second predetermined angles are symmetrical with respect to a direction vertical to a plane in which the plurality of magnetic field sensing elements are arranged.

8 Claims, 12 Drawing Sheets

OPPOSING DIRECTION PATTERN

FIG. 12

MR LOOP CHARACTERISTIC
DEPENDING ON PATTERN VIRECTION

MAGNETIC DETECTOR WHEREIN THE MAGNETIC FLUX CROSSES THE SENSING ELEMENTS AT A PREDETERMINED ANGLE

BACKGROUND OF THE INVENTION

1. Field of the Invention

The present invention relates to a magnetic detector for detecting changes in a magnetic field caused by movement of a moving member of magnetic material, and more particularly to a magnetic detector with a function of detecting alternately projected and recessed portions of a moving member of magnetic material in a power-on condition (referred to as a power-on function hereinafter).

2. Description of the Related Art

There is a known technique for detecting changes in a magnetic field wherein electrodes are formed at both ends of a magnetism sensitive surface of each magnetic field sensing devices (magnetoresistive devices are used in the description here) to construct a bridge, a constant-voltage and constant-current power supply is connected between the two opposing electrodes of the bridge to convert changes in the resistance value of the magnetic field sensing device into voltage changes, and changes in the magnetic field acting on the magnetic field sensing devices are detected on the basis of the voltage changes.

Figure 14:
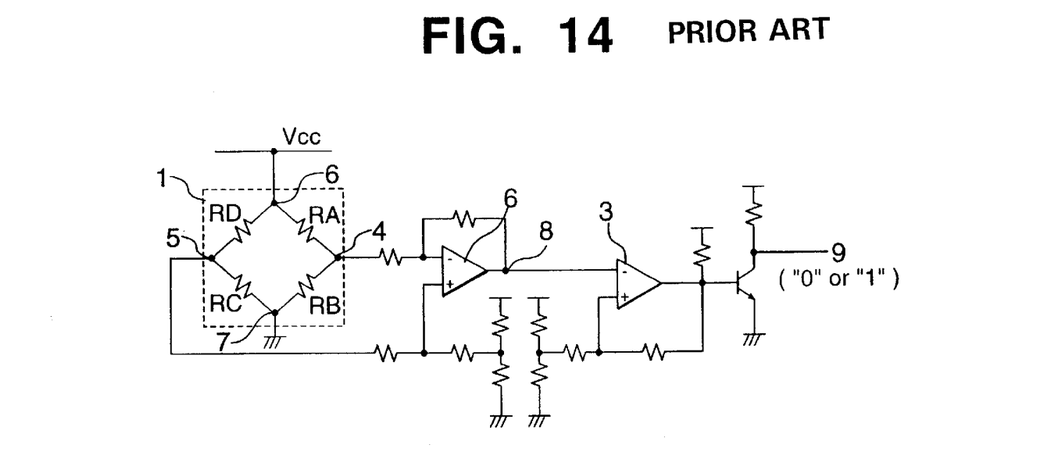
FIG. 14 is a circuit diagram showing an arrangement of a processing circuit in a sensor using ordinary magnetic field sensing devices.

FIG. 14 is a circuit diagram showing an arrangement of a processing circuit in such a sensor using ordinary magnetic field sensing devices.

In FIG. 14, a Wheatstone bridge circuit 1 is made up of magnetic field sensing devices or resistances RA, RB, RC and RD given including at least one or more magnetic field sensing devices. Input terminals of a differential amplification circuit 2 are connected to a middle junction 4 between RA, RB and a middle junction 5 between RC, RD. A middle junction between RA, RD is connected to a power source terminal Vcc, and a middle junction between RB, RC is connected to a ground GND. A differential amplification output 8 from the differential amplification circuit 2 is supplied to a comparison circuit 3 in a next stage.

In the above circuit, resistance values of the magnetic field sensing devices are changed upon changes in the magnetic field applied to resistances RA, RB, and a voltage at the middle junction 4 between RA, RB is changed correspondingly to such changes in the applied magnetic field. The voltage across the middle junctions 4 and 5 is amplified by the differential amplification circuit 2, and a final output 9 having a level of "0" or "1" is obtained from the comparison circuit 3.

Figure 15:
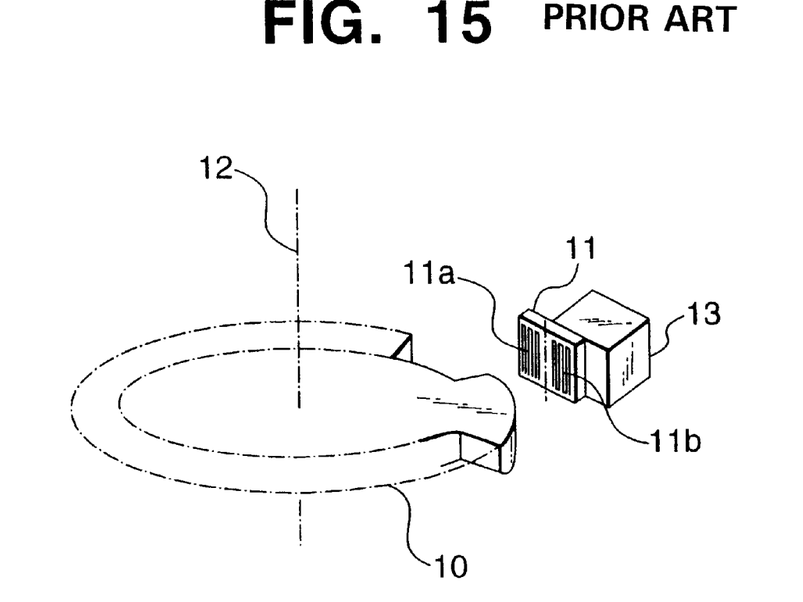
FIG. 15 is a schematic view showing a construction of a conventional magnetic detector.
Figure 16:
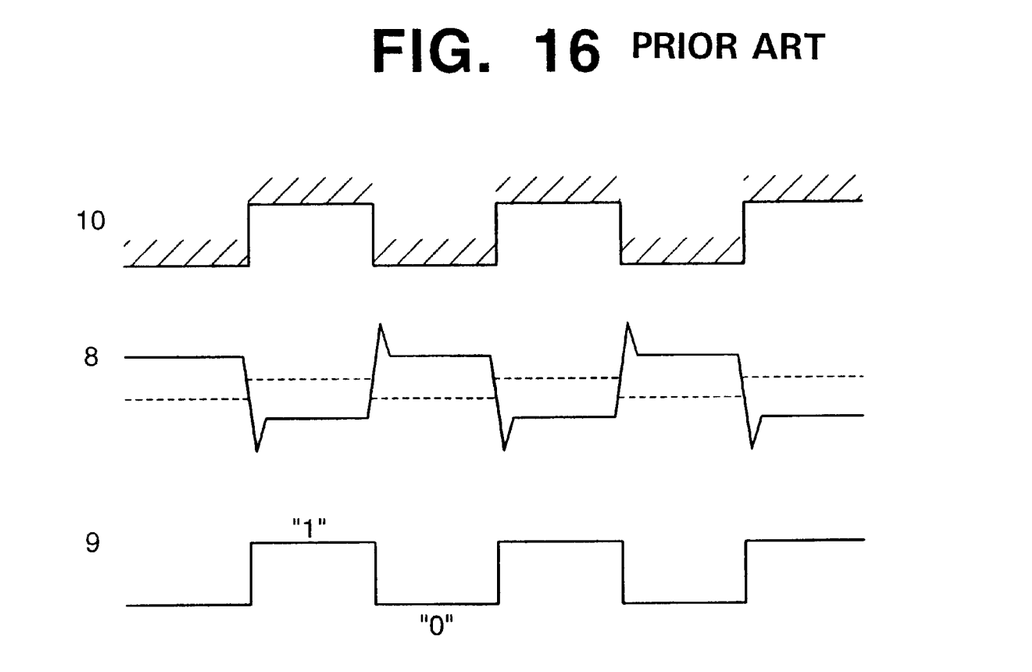
FIG. 16 is a timing chart showing output signals in the conventional magnetic detector.

FIG. 15 is a schematic view showing a construction of a conventional magnetic detector.

In FIG. 15, the conventional magnetic detector comprises a rotary member of magnetic material 10 having a shape capable of changing a magnetic field, a magnetic field sensing device 11, magnetic field sensing elements 11a, 11b, a magnet 13, and a rotary shaft 12. When the rotary shaft 12 rotates, the rotary member of magnetic material 10 is also rotated in a synchronous relation therewith.

The pitch center of the magnetic field sensing elements (resistances) 11a, 11b of the magnetic field sensing device 11 is arranged to be offset from the center of the magnet 13 by a predetermined amount.

Figure 11:
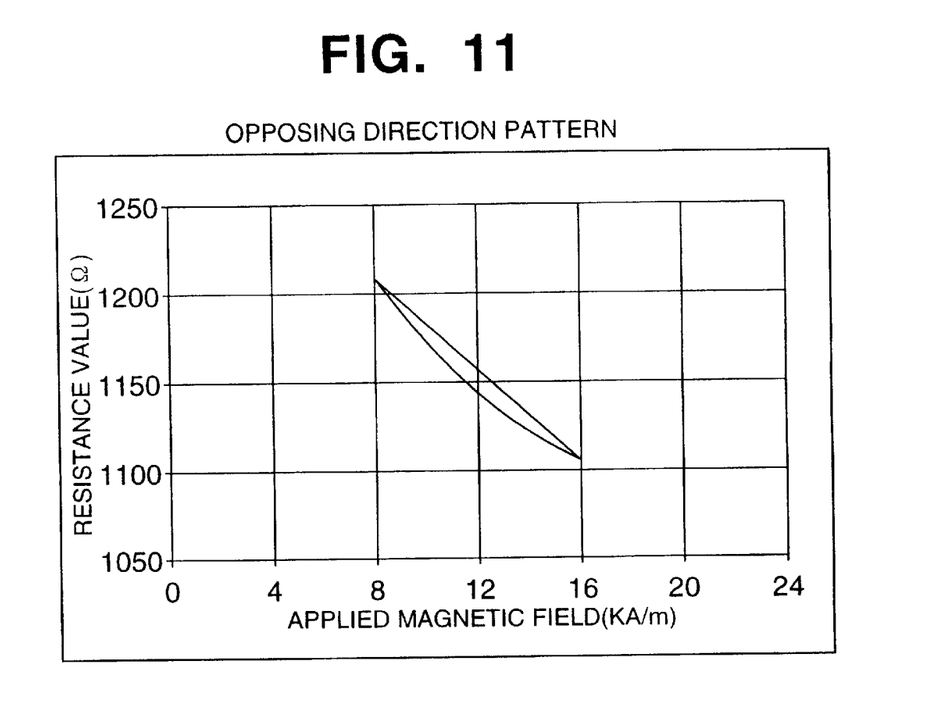
FIG. 11 is a graph explaining Embodiment 4 of the present invention.

In the above magnetic detector, upon rotation of the rotary member of magnetic material 10, the magnetic field applied to the resistances 11a, 11b of the magnetic field sensing device 11 is changed, and as shown in by way of example FIG. 11, the differential amplification output 8 is changed correspondingly to the shape of the rotary member of magnetic material 10. As a result, a signal representing the final output 9 corresponding to the shape of the rotary member of magnetic material 10 can be obtained with the circuit shown in FIG. 14.

However, the magnetic circuit arrangement used in the conventional detector has had the following problems.

Figure 17:
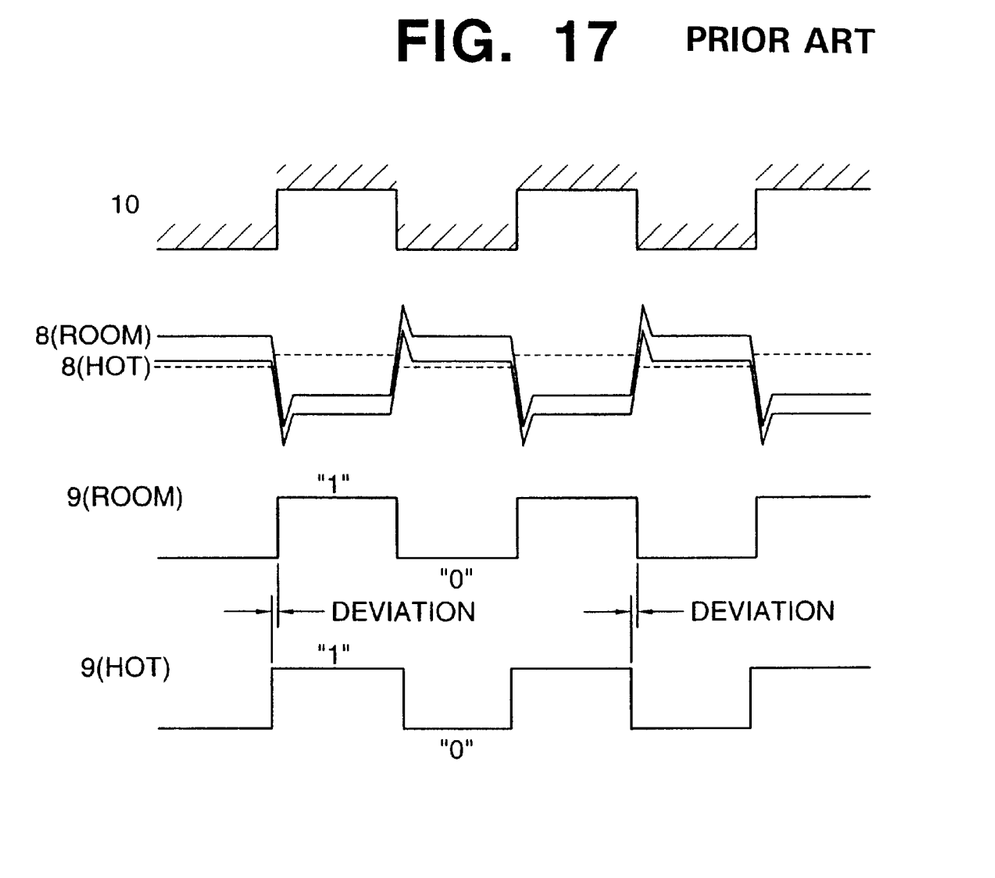
FIG. 17 is a timing chart showing output signals in the conventional magnetic detector.

When the bridge is made up of magnetic field sensing devices and fixed resistances, a difference between their temperature coefficients. Also, when the bridge is made up of magnetic field sensing devices with a plurality of elements, a difference in the temperature coefficients occurs due to a difference in the magnetic field applied to the elements. Since there is such a difference in temperature coefficients, as shown in FIG. 17, the differential amplification output 8 (ROOM) at room temperature and the differential amplification output 8 (HOT) at high temperature exhibit temperature characteristics depending on changes in the applied magnetic field. This gives rise to a large deviation in the edge detecting accuracy of the alternately projected and recessed portions of the rotary member of magnetic material.

SUMMARY OF THE INVENTION

An object of the present invention is to provide a magnetic detector with a power-on function which can essentially eliminate the temperature characteristics of a magnetic field sensing device and improve the temperature characteristics of the edge detecting accuracy for alternately projected and recessed portions of a moving member of magnetic material.

A magnetic detector according to a first aspect of the present invention comprises a magnetic field generating means for generating a magnetic field, a moving member of magnetic material disposed with a predetermined gap remaining relative to the magnetic field generating means and having alternately projected and recessed portions to change the magnetic field generated by the magnetic field generating means, and a magnetic field sensing device comprising a plurality of magnetic field sensing elements that detects changes in the magnetic field by movement of the moving member of magnetic material, wherein the magnetic flux crosses the plurality of magnetic field sensing elements at a first predetermined angle when the recessed portion of the moving member of magnetic material is opposed to the magnetic field sensing device, the magnetic flux crosses the plurality of magnetic field sensing elements at a second predetermined angle when the projected portion of the moving member of magnetic material is opposed to the magnetic field sensing device, and the first and second predetermined angles are symmetrical with respect to the direction vertical to a plane in which the plurality of magnetic field sensing elements are arranged.

In a magnetic detector according to a second aspect of the present invention, in addition to the features of the first aspect, the magnetic field generating means disposed in opposing relation to the alternately projected and recessed portions of the moving member of magnetic material is magnetized in the opposing direction, and the magnetic field sensing device is arranged to lie parallel to the opposing direction.

In a magnetic detector according to a third aspect of the present invention, in addition to the features of the first aspect, the magnetic field generating means disposed in opposing relation to the alternately projected and recessed portions of the moving member of magnetic material is magnetized vertically to the opposing direction, and the magnetic field sensing device is arranged to lie parallel to the opposing direction.

In a magnetic detector according to a fourth aspect of the present invention, in addition to the features of the second aspect, the pitch center of the plurality of magnetic field sensing elements of the magnetic field sensing device is substantially aligned with an end of the magnetic field generating means nearer to the moving member of magnetic material.

In a magnetic detector according to a fifth aspect of the present invention, in addition to the features of the first aspect, a GMR (gigantic magnetoresistive) device is used as the magnetic field sensing device.

In a magnetic detector according to a sixth aspect of the present invention, in addition to the features of the fifth aspect, a magnetoresistive pattern of the magnetic field sensing device is formed to extend vertically to the opposing direction of the magnetic field generating means to the moving member of magnetic material.

In a magnetic detector according to a seventh aspect of the present invention, in addition to the features of the fifth aspect, a magnetoresistive pattern of the magnetic field sensing device is formed to extend in the opposing direction of the magnetic field generating means to the moving member of magnetic material.

In a magnetic detector according to an eighth aspect of the present invention, in addition to the features of the first aspect, the moving member of magnetic material is a rotary member of magnetic material rotating in synchronization with a rotary shaft.

DESCRIPTION OF THE PREFERRED EMBODIMENTS

Preferred embodiments of the present invention will be described below with reference to the drawings.

Embodiment 1

Figure 1:
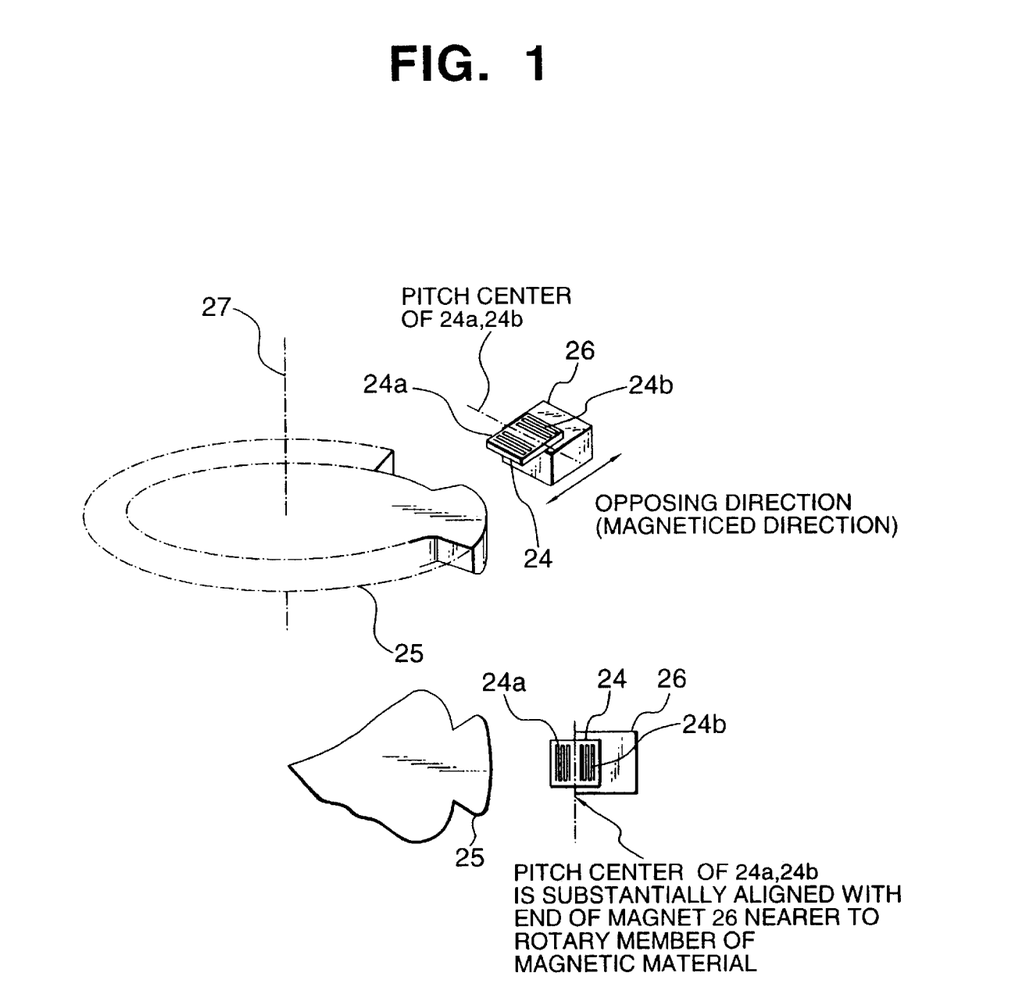
FIG. 1 is a schematic view showing a construction of a magnetic detector according to Embodiment 1 of the present invention.

FIG. 1 is a schematic view showing a construction of a magnetic detector according to Embodiment 1 of the present invention.

The arrangement of a processing circuit in this embodiment may be the same as the above-described conventional one shown in FIG. 14. The magnetic field sensing devices (resistances) RA, RB in FIG. 14 correspond to the magnetic field sensing devices used in this embodiment. In the following description of this embodiment, a magnetoresistive device is used as the magnetic field sensing device.

In FIG. 1, the magnetic detector comprises a magnetoresistive device 24, magnetic field sensing resistances (elements) 24a, 24b which essentially form the magnetoresistive device 24 and construct a bridge, a rotary member of magnetic material 25 as a moving member of magnetic material, a magnet 26 as magnetic field generating means, and a rotary shaft 27.

The magnet 26 is arranged in opposing relation to the rotary member of magnetic material 25 and is magnetized in the opposing direction. The magnetoresistive device 24 is disposed to lie in the magnetized direction of the magnet 26 such that one pair (or two pairs) of magnetic field sensing resistances are arranged parallel to each other in the magnetized direction of the magnet 26 and aligned with a line extending in the magnetized direction thereof. The rotary member of magnetic material 25 has a shape capable of changing the magnetic field applied to the magnetoresistive device 24, and is rotated in synchronization with rotation of the rotary shaft 27.

Figure 2:
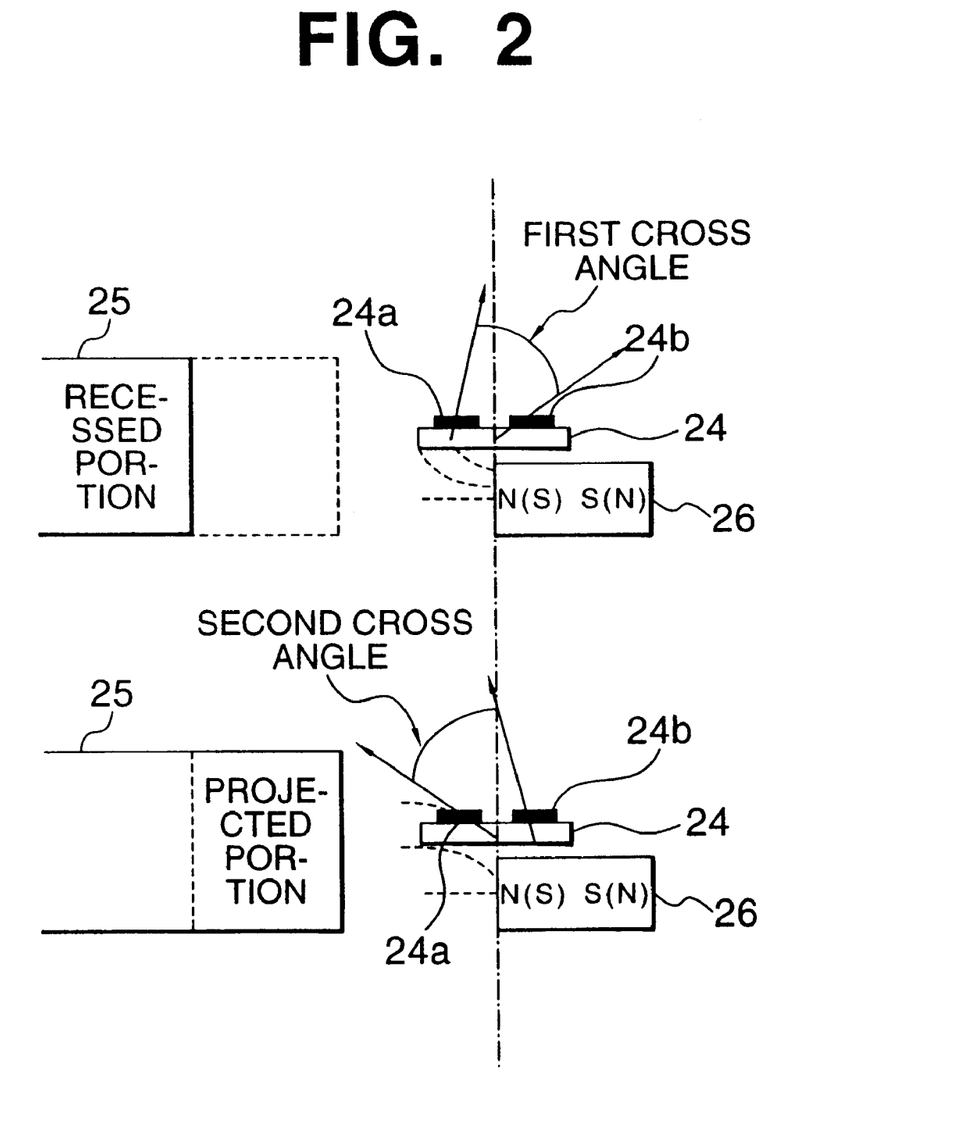
FIG. 2 is an explanatory view showing change of a magnetic field vector in Embodiment 1 of the present invention.

FIG. 2 shows the vector direction of a magnetic field applied to the magnetoresistive device in the magnetic circuit of this embodiment.

The magnetic flux crosses the magnetic field sensing resistances 24a, 24b at a first predetermined angle when the recessed portion of the rotary member of magnetic material 25 is opposed to the magnetoresistive device 24. The magnetic flux crosses the magnetic field sensing resistances 24a, 24b at a second predetermined angle when the projected portion of the rotary member of magnetic material 25 is opposed to the magnetoresistive device 24. The magnetic field sensing resistances 24a, 24b are arranged so that the first and second predetermined angles are symmetrical with respect to the direction vertical to a plane in which the magnetic field sensing resistances are disposed.

Such an arrangement can be realized by setting the pitch center of the magnetic field sensing resistances 24a, 24b to be substantially aligned with an end of the magnet 26 nearer to the rotary member of magnetic material.

Figure 3:
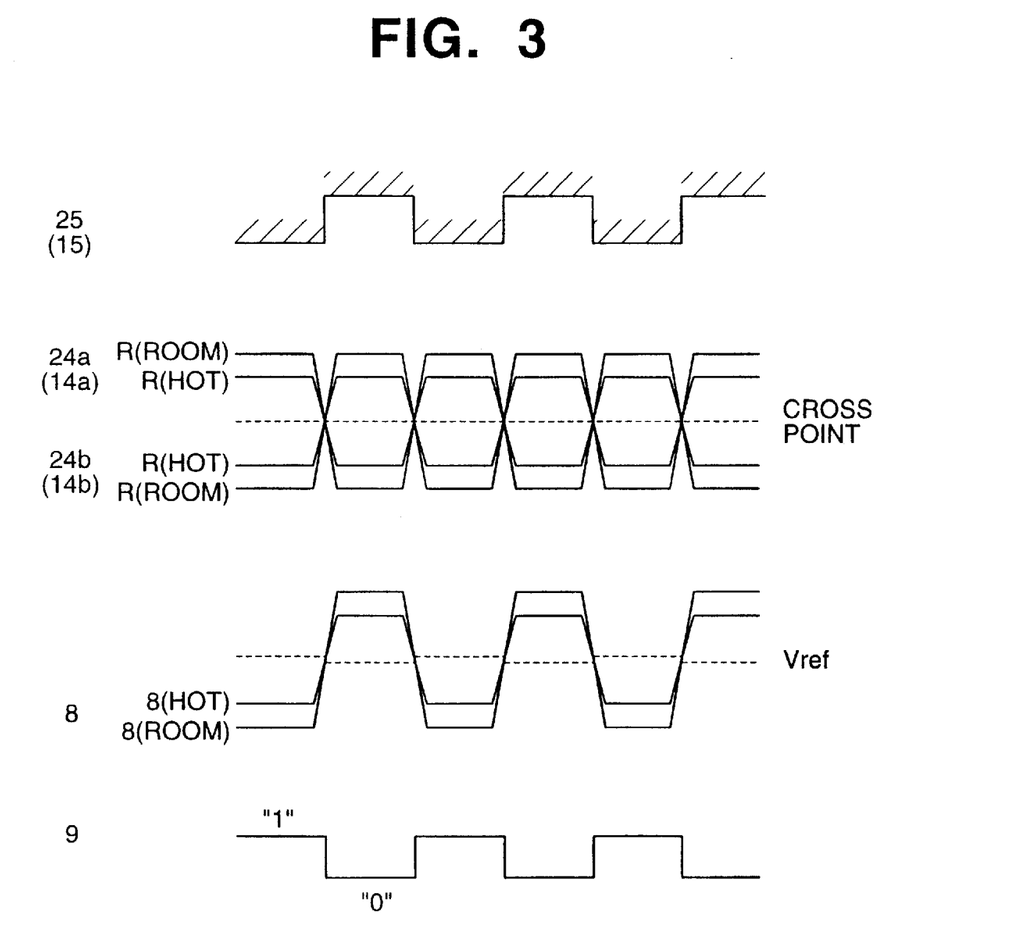
FIG. 3 is a timing chart showing output signals in Embodiment 1 of the present invention.

The operation of the magnetic detector will now be described with reference to FIG. 3.

Changes in the resistance values of the magnetic field sensing resistances 24a, 24b, caused by changes in the magnetic field corresponding to the alternately projected and recessed portions of the rotary member of magnetic material 25, at room temperature are represented by R(ROOM) and at high temperature by R(HOT).

The magnetic field applied to the magnetic field sensing resistances 24a, 24b is symmetrically changed depending on the alternately projected and recessed portions of the rotary member of magnetic material 25, as described above with reference to FIG. 2, and the resistance values of the magnetic field sensing resistances 24a, 24b are also symmetrically changed. This means that the resistance values of the magnetic field sensing resistances 24a, 24b agree with each other at any point in both room temperature and high temperature conditions. Consequently, in the bridge comprised of the magnetic field sensing resistances 24a, 24b, the differential amplification output 8 (ROOM) at room temperature and the differential amplification output 8 (HOT) at high temperature cross each other. The temperature characteristics of edge detecting accuracy of the alternately projected and recessed portions of the rotary member of magnetic material 25 can be improved by setting a comparison level Vref of the comparison circuit 3 to the cross point of the temperature characteristic lines representing the differential amplification outputs 8, and a signal that precisely corresponds to the alternately projected and recessed portions of the rotary member of magnetic material 25 and that is capable of providing the power-on function can be obtained.

Figure 4:
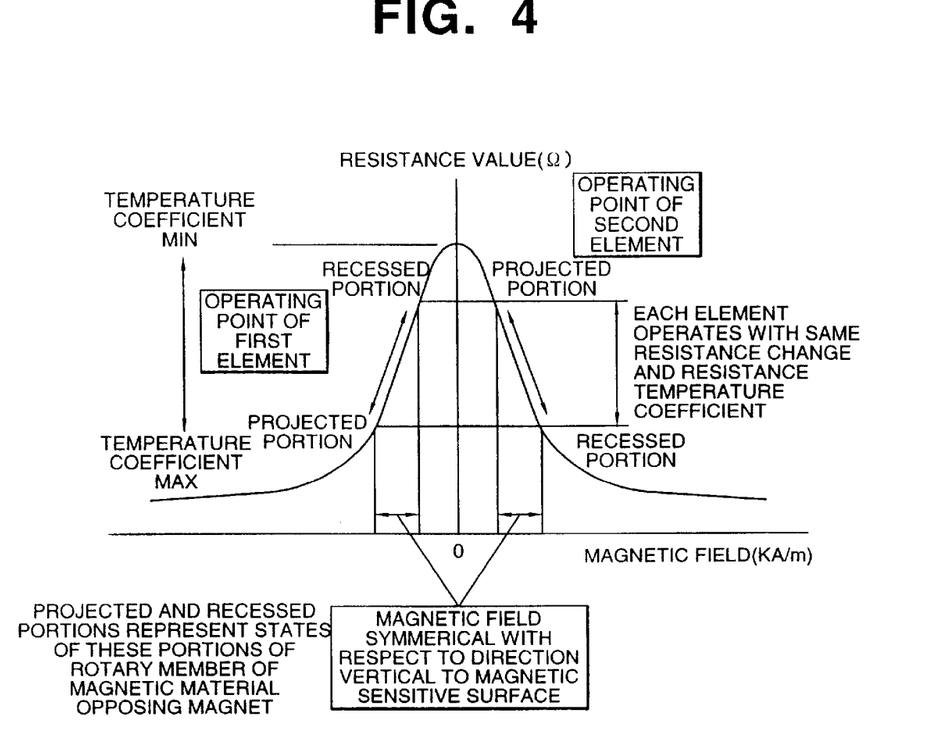
FIG. 4 is a graph explaining the operation of Embodiment 1 of the present invention.

FIG. 4 shows the relationship between resistance changes and the resistance temperature coefficient with respect to the magnetic field applied to the magnetoresistive device. As can be seen from FIG. 4, the magnetoresistive device has different resistance temperature coefficients depending on its resistance value which varies with the applied magnetic field. Consequently, a pair of magnetic field sensing elements are operated while being subject to changes in magnetic field so as to exhibit resistance values and temperature coefficients which are coincident with each other in a symmetrical relationship, thereby canceling temperature characteristics of the magnetic field sensing elements, i.e., eliminating temperature characteristics of the magnetoresistive device.

In this embodiment, as described above, since the resistance values and temperature coefficients of the pair of magnetic field sensing elements constituting the magnetic field sensing device are changed-in a symmetrical relationship by changes in magnetic field corresponding to the alternately projected and recessed portions of the rotary member of magnetic material, by constructing a bridge with one pair of magnetic field sensing elements or a Wheatstone bridge with two pairs of magnetic field sensing elements, it is possible to eliminate temperature characteristics of the magnetic field sensing device, to improve the edge detecting accuracy of the alternately projected and recessed portions of the rotary member of magnetic material, and to ensure the power-on function.

Further, since the magnet and the magnetic field sensing device are both arranged parallel to each other in the direction opposed to the alternately projected and recessed portions of the rotary member of magnetic material, leads used for wiring or bending work necessary for insertion, etc. are omitted and productivity can be improved.

Additionally, by setting the pitch center of the magnetic field sensing resistances to be substantially aligned with the end of the magnet nearer to the rotary member of magnetic material, the magnetic field sensing resistances can be surely arranged so that the first and second predetermined angles are symmetrical with respect to the direction vertical to the plane in which the magnetic field sensing resistances are disposed.

Embodiment 2

Figure 5:
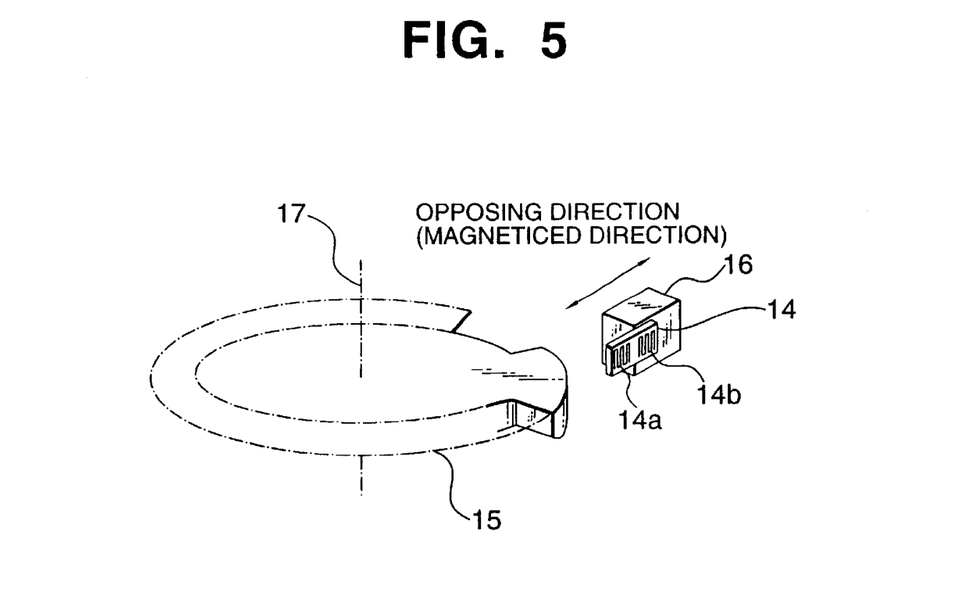
FIG. 5 is a schematic view showing a construction of a magnetic detector according to Embodiment 2 of the present invention.

FIG. 5 is a schematic view showing construction of a magnetic detector according to Embodiment 2 of the present invention.

Embodiment 2 is basically the same as above Embodiment 1 except that the magnet 26 including the magnetoresistive device 24, shown in FIG. 1, is rotated 90° with respect to the rotary member of magnetic material 25. In FIG. 5, a magnetoresistive device 14, magnetic field sensing resistances (elements) 14a, 14b which essentially form the magnetoresistive device 14 and construct a bridge, a rotary member of magnetic material 15 as a moving member of magnetic material, a magnet 16 as magnetic field generating means, and a rotary shaft 17 correspond respectively to the magnetoresistive device 24, the magnetic field sensing resistances 24a, 24b, the rotary member of magnetic material 25, the magnet 26 and the rotary shaft 27.

Accordingly, the operating principles and advantages of this embodiment are the same as in Embodiment 1; hence the description thereof is not repeated here.

Embodiment 3

FIG. 6 is a schematic view showing a construction of a magnetic detector according to Embodiment 3 of the present invention.

In Embodiments 1 and 2, the magnet is magnetized in the direction opposing to the rotary member of magnetic material, while in Embodiment 3, the magnet is magnetized in a direction vertical to the direction opposing to the rotary member of magnetic material and in a direction vertical to the magnetic sensitive surface of the magnetic field sensing device.

Figure 6A:
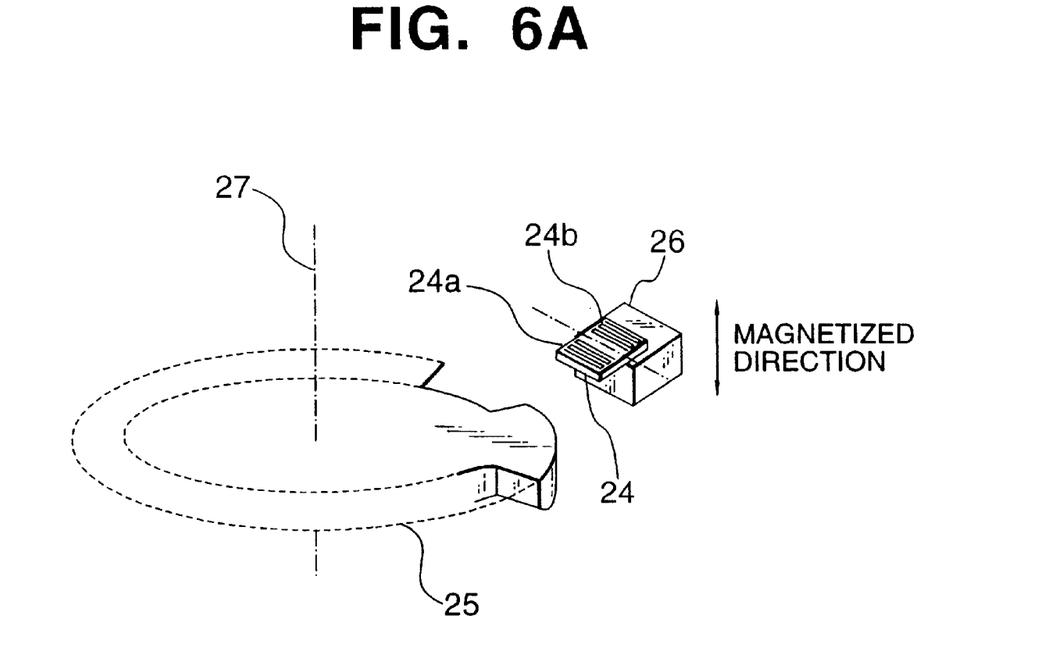
FIG. 6 is a schematic view showing a construction of a magnetic detector according to Embodiment 3 of the present invention.
Figure 6B:
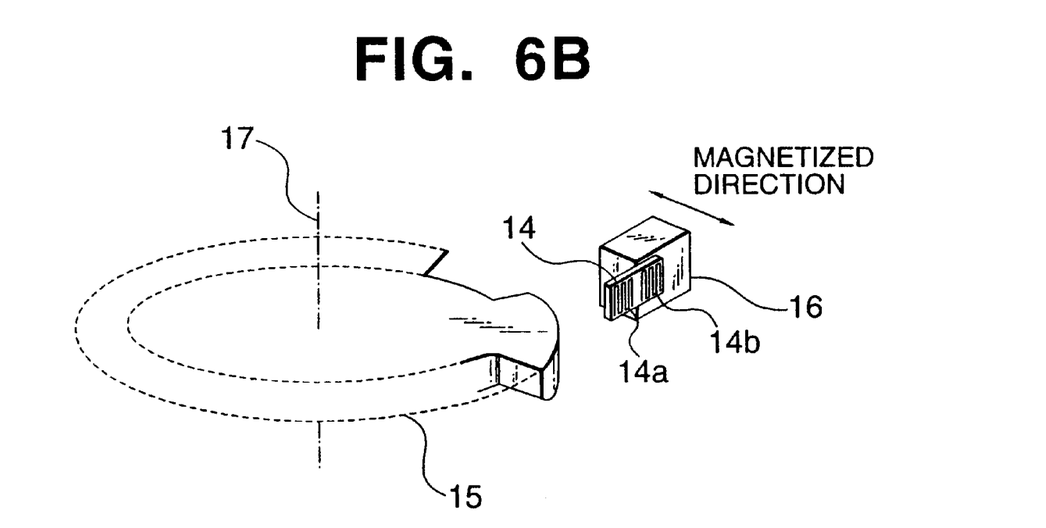

FIG. 6A basically corresponds to FIG. 1 representing Embodiment 1 and FIG. 6B basically corresponds to FIG. 4 representing Embodiment 2. In FIGS. 6A and 6B, therefore, components corresponding to those in FIG. 4 are denoted by the same reference numerals.

Also, the construction of the magnetic detector of this embodiment is the same as corresponding one of Embodiments 1 and 2 except that the magnet 26 (or 16) is magnetized in a direction vertical to the direction opposing to the rotary member of magnetic material 25 (or 14) and in a direction vertical to the magnetic sensitive surface of the magnetoresistive device 24 (or 14).

The processing circuit arrangement, operating principles and advantages of this embodiment are the same as in Embodiment 1; hence the description thereof is not repeated here.

Embodiment 4

In Embodiment 4, the so-called gigantic magnetoresistive device (referred to as GMR device hereinafter) is used as the magnetoresistive device. A magnetoresistive pattern of the GMR device will be first described below.

A GMR device is a so-called artificial lattice film, i.e., a laminate manufactured by alternately forming a magnetic layer and a non-magnetic layer with thicknesses of several angstroms to several tens of angstroms one on top of the other as described in "Magnetoresistance Effect of Artificial Lattice", Journal of the Applied Magnetism Society of Japan, Vol. 15, No. 51991, pp. 813–821. Such known artificial lattice films are represented by (Fe/Cr)$_n$, (Permalloy/Cu/Co/Cu)$_n$, and (Co/Cu)$_n$ (where n is the number of layered films). The GMR device exhibits a much greater MR effect (MR change rate) than an ordinary magnetoresistive device (referred to as MR device hereinafter), and the MR effect is developed depending only on relative angle between the magnetized directions of adjacent magnetic layers. Thus, the GMR device is an in-plane magnetic sensitive device which produces the same resistance changes regardless of any angular difference in the direction of an external magnetic field with respect to a current. The GMR device can also develop anisotropy when the magnetoresistive pattern is formed to have a narrow width.

Another feature of the GMR device is that it has a hysteresis in resistance changes caused by changes in the applied magnetic field, and a temperature characteristic, particularly a high temperature coefficient.

Figure 7:
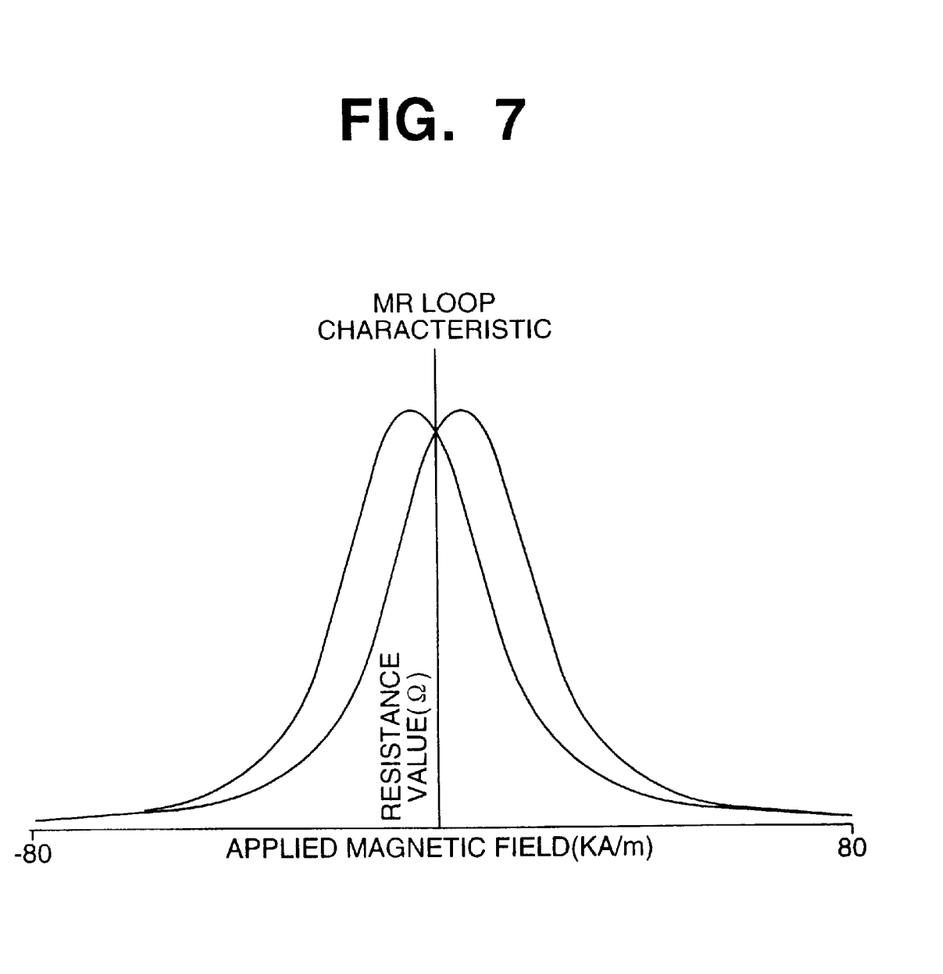
FIG. 7 is a graph showing an MR characteristic of a GMR device.

FIG. 7 shows typical resistance changes (referred to as MR characteristic hereinafter) of the GMR device with respect to the applied magnetic field.

The detector construction and the processing circuit arrangement in this embodiment are essentially the same as in Embodiment 1 or 2, and hence the description thereof is omitted here. The construction and advantageous effect of a magnetoresistive pattern formed on the GMR device will be described below.

Figure 8:
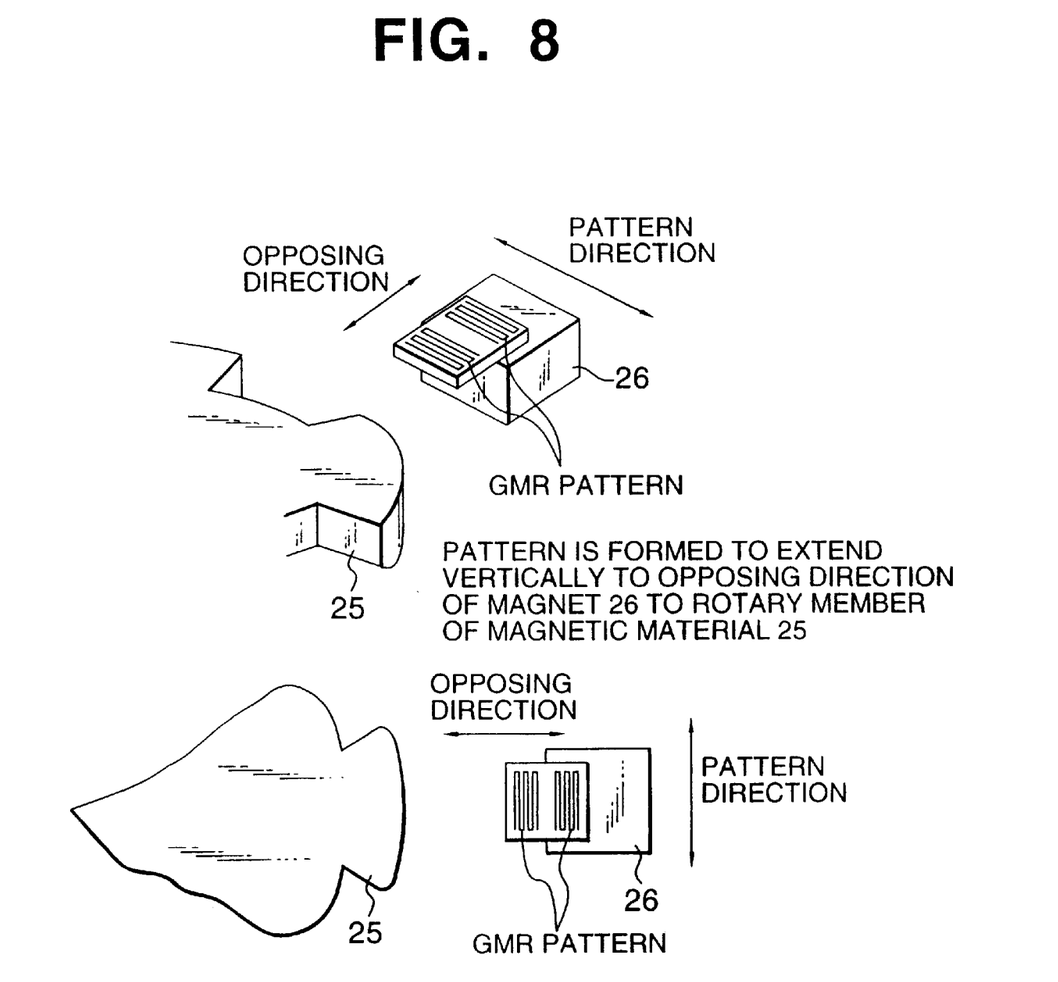
FIG. 8 is a schematic view explaining pattern formation of magnetic field sensing elements in a magnetic detector according to Embodiment 4 of the present invention.
Figure 9:
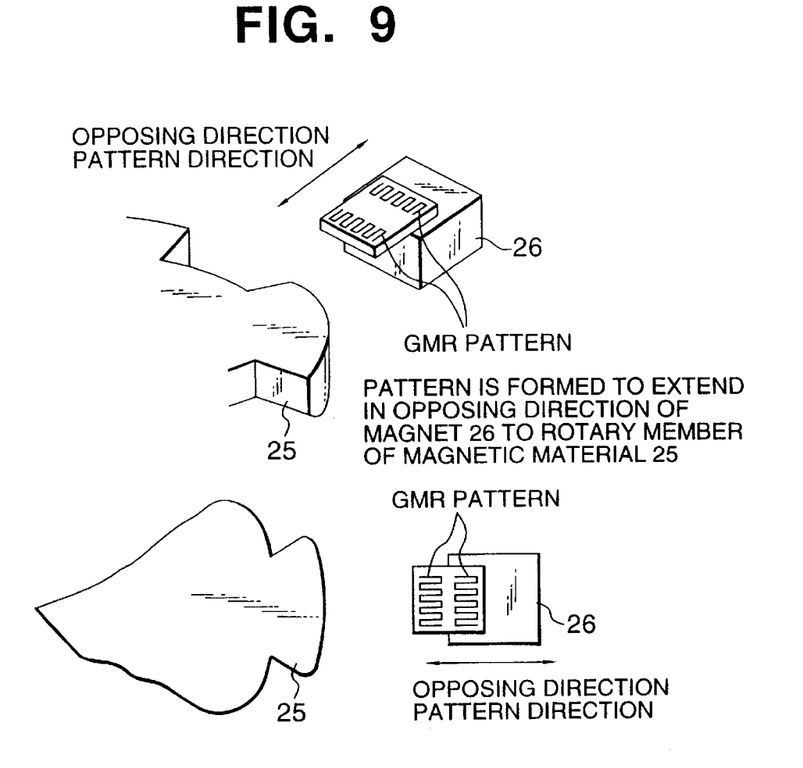
FIG. 9 is a schematic view explaining pattern formation of magnetic field sensing elements in the magnetic detector according to Embodiment 4 of the present invention.

FIGS. 8 and 9 show two kinds of magnetoresistive patterns each of which has a width of about 10 µm.

The magnetoresistive pattern shown in FIG. 8 is formed to extend vertically to the opposing direction of the magnet 26 to the rotary member of magnetic material 25, whereas the magnetoresistive pattern shown in FIG. 9 is formed to extend in the opposing direction of the magnet 26 to the rotary member of magnetic material 25.

The magnetic field applied to those patterns is changed in different directions. The pattern extending in the opposing direction is subject to changes in the applied magnetic field parallel to the pattern. The pattern extending in the vertical direction is subject to changes in the applied magnetic field vertical to the pattern.

Usually employed changes in the applied magnetic field are ranging 8 kA/m~16 kA/m (−16 kA/m~−8 kA/m), for example, in the MR characteristic of the GMR device shown in FIG. 7 where the resistance change rate is maximum.

Figure 10:
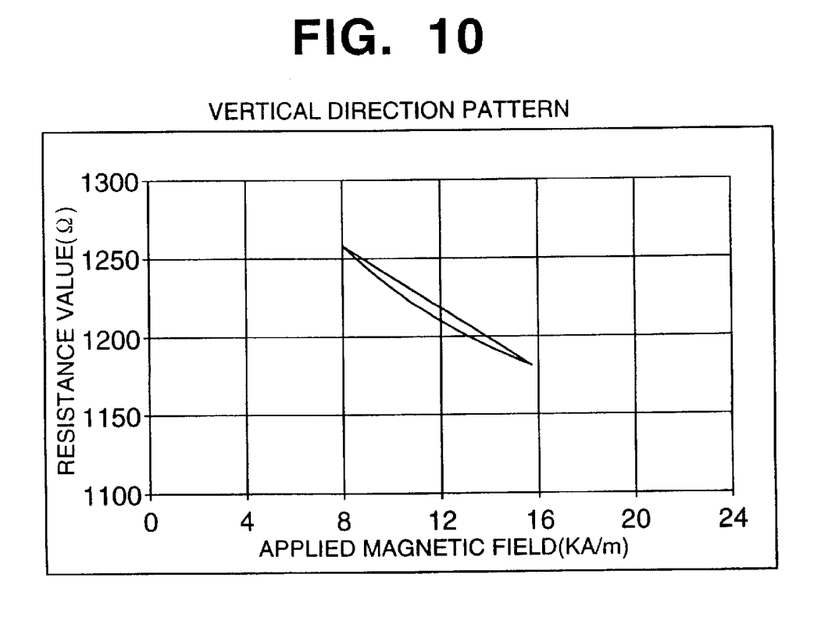
FIG. 10 is a graph explaining Embodiment 4 of the present invention.

FIGS. 10 and 11 show resistance changes in the above range of changes in the applied magnetic field depending on the two kinds of magnetoresistive patterns, respectively. As seen from the graphs of FIGS. 10 and 11, the resistance value is changed in different ranges depending on the patterns. Specifically, in the case of using the magnetoresistive pattern formed to extend in the opposing direction of the magnet 26 to the rotary member of magnetic material 25 as shown in FIG. 9, larger resistance changes of the GMR device are available.

Figure 12:
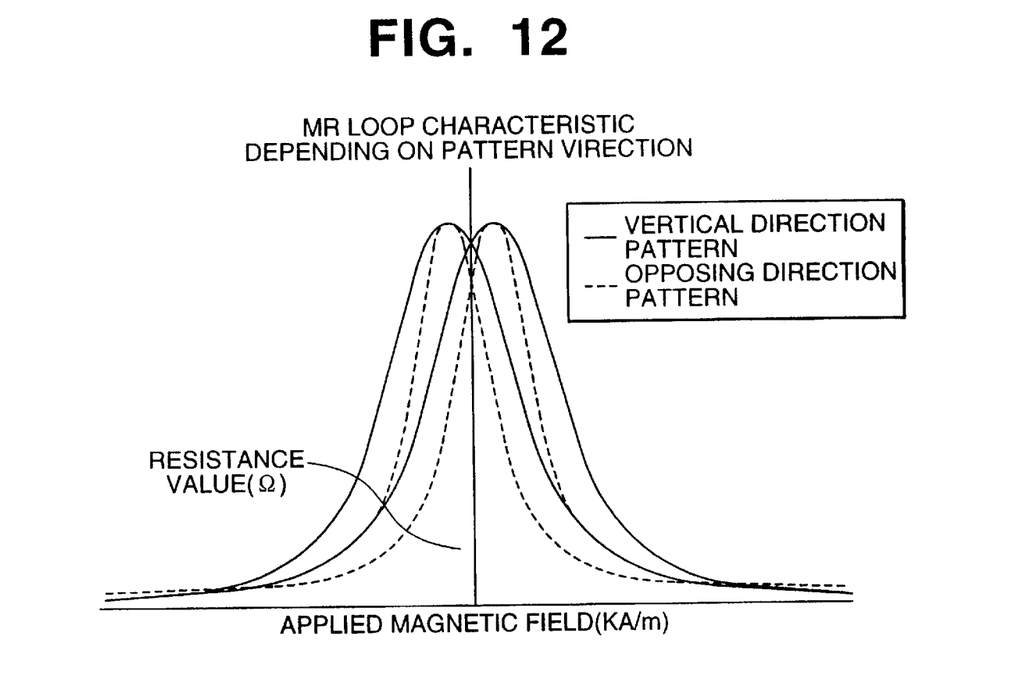
FIG. 12 is a graph showing an MR characteristic in Embodiment 4 of the present invention.
Figure 13:
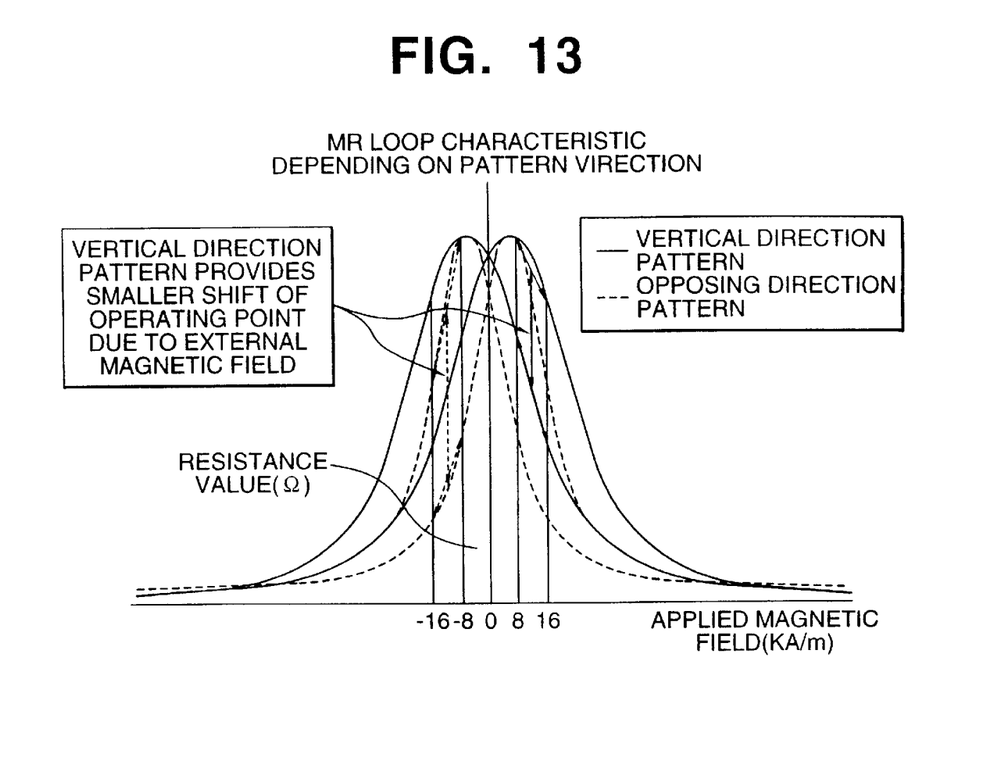
FIG. 13 is a graph showing an MR characteristic in Embodiment 4 of the present invention.

FIG. 12 shows MR characteristics resulted when a magnetic field of ±80 kA/m is applied to the above two kinds of magnetoresistive patterns. A point to be noted here is that there is a hysteresis in each MR characteristic. As seen from the graph of FIG. 12, the opposing direction pattern has a smaller hysteresis than the vertical direction pattern. It is thus understood that when the magnetic detector is operated under the applied magnetic field of 8 kA/m~16 kA/m (−16 kA/m~−8 kA/m), for example, the vertical direction pattern provides a smaller shift of the operating point due to a disturbing magnetic field than the opposing direction pattern, as shown in FIG. 13.

In other words, where a disturbing magnetic field is not required to be taken into consideration, the opposing direction pattern is more advantageous, and where a disturbing magnetic field should be taken into consideration, the vertical direction pattern is more advantageous.

With this embodiment, as described above, by using a GMR device and selectively constructing a magnetoresistive pattern depending on the environment where the magnetic detector is installed, an SN ratio is improved and a signal corresponding to the alternately projected and recessed portions of the rotary member of magnetic material can be obtained with higher accuracy.

It is needless to say that when the present invention is applied to a linear displacement detector wherein the rotary member of magnetic material used in each of the above embodiments is replaced with a magnetic body which has alternately projected and recessed portions and is displaced linearly, similar advantages can also be obtained with similar processing circuit arrangement and magnetic circuit arrangement.

What is claimed is:

1. A magnetic detector comprising:

magnetic field generating means for generating a magnetic field, a moving member of magnetic material disposed with a predetermined gap remaining relative to said magnetic field generating means and having alternately projected and recessed portions to change the magnetic field generated by said magnetic field generating means, and a magnetic field sensing device comprising a plurality of magnetic field sensing elements for detecting changes in the magnetic field by movement of said moving member of magnetic material, wherein the magnetic flux crosses said plurality of magnetic field sensing elements at a first predetermined angle when the recessed portion of said moving member of magnetic material is opposed to said magnetic field sensing device, the magnetic flux crosses said plurality of magnetic field sensing elements at a second predetermined angle when the projected portion of said moving member of magnetic material is opposed to said magnetic field sensing device, and said first and second predetermined angles are symmetrical with respect to a direction vertical to a plane in which said plurality of magnetic field sensing elements are arranged.

2. A magnetic detector according to claim 1, wherein said magnetic field generating means disposed in opposing relation to the alternately projected and recessed portions of said moving member of magnetic material is magnetized in said opposing direction, and said magnetic field sensing device is arranged to lie parallel to said opposing direction.

3. A magnetic detector according to claim 1, wherein said magnetic field generating means di ed in opposing relation to the alternately projected and recessed portions of said moving member of magnetic material is magnetized vertically to said opposing direction, and said magnetic field sensing device is arranged to lie parallel to said opposing direction.

4. A magnetic detector according to claim 2, wherein the pitch center of the plurality of magnetic field sensing elements of said magnetic field sensing device is substantially aligned with an end of said magnetic field generating means nearer to said moving member of magnetic material.

5. A magnetic detector according to claim 1, wherein a GMR (gigantic magnetoresistive) device is used as said magnetic field sensing device.

6. A magnetic detector according to claim 5, wherein a magnetoresistive pattern of said magnetic field sensing device is formed to extend vertically to the opposing direction of said magnetic field generating means to said moving member of magnetic material.

7. A magnetic detector according to claim 5, wherein a magnetoresistive pattern of said magnetic field sensing device is formed to extend in the opposing direction of said magnetic field generating means to said moving member of magnetic material.

8. A magnetic detector according to claim 1, wherein said moving member of magnetic material is a rotary member of magnetic material rotating in synchronization with a rotary shaft.

* * * * *